(12) United States Patent
Hwang

(10) Patent No.: US 10,650,714 B2
(45) Date of Patent: May 12, 2020

(54) VOLUMETRIC TYPE THREE-DIMENSIONAL DISPLAY DEVICE

(71) Applicant: LG DISPLAY CO., LTD., Seoul (KR)

(72) Inventor: JungSub Hwang, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/160,386

(22) Filed: Oct. 15, 2018

(65) Prior Publication Data
US 2019/0122595 A1 Apr. 25, 2019

(30) Foreign Application Priority Data

Oct. 24, 2017 (KR) ......................... 10-2017-0138735

(51) Int. Cl.
| | | |
|---|---|---|
| G09G 3/00 | (2006.01) | |
| G02F 1/1334 | (2006.01) | |
| H01L 51/52 | (2006.01) | |
| H01L 27/32 | (2006.01) | |
| G09G 3/20 | (2006.01) | |
| G09G 3/3208 | (2016.01) | |
| G02B 30/50 | (2020.01) | |
| G09G 3/36 | (2006.01) | |

(52) U.S. Cl.
CPC ............. *G09G 3/003* (2013.01); *G02B 30/50* (2020.01); *G02F 1/1334* (2013.01); *G09G 3/2003* (2013.01); *G09G 3/3208* (2013.01); *H01L 27/3232* (2013.01); *H01L 27/3276* (2013.01); *H01L 27/3288* (2013.01); *H01L 51/524* (2013.01); *H01L 51/5253* (2013.01); *G09G 3/36* (2013.01); *G09G 2300/023* (2013.01); *G09G 2300/0452* (2013.01); *H01L 27/3211* (2013.01)

(58) Field of Classification Search
CPC .... G09G 3/003; G09G 3/2003; G09G 3/3208; G09G 3/36; G09G 2300/023; G09G 2300/0452; G02B 27/2271; G02B 27/22; G02F 1/1334; G02F 1/134309; H01L 51/5253; H01L 27/3276; H01L 27/3232; H01L 27/3288; H01L 51/524; H01L 27/3211
See application file for complete search history.

(56) References Cited

U.S. PATENT DOCUMENTS

| | | | | |
|---|---|---|---|---|
| 5,801,666 A | * | 9/1998 | MacFarlane | ....... G02B 27/2271 345/6 |
| 5,929,572 A | * | 7/1999 | Whitesell | ............... G09G 3/003 313/500 |
| 6,377,229 B1 | * | 4/2002 | Sullivan | ............. G02B 27/2278 345/6 |

(Continued)

FOREIGN PATENT DOCUMENTS

| | | |
|---|---|---|
| KR | 10-2008-0114173 A | 12/2008 |
| KR | 10-2017-0044703 A | 4/2017 |

*Primary Examiner* — Chad M Dicke
(74) *Attorney, Agent, or Firm* — Birch, Stewart, Kolasch & Birch, LLP

(57) ABSTRACT

A volumetric type three-dimensional display device can include a plurality of voxels having a polyhedron shape laminated three-dimensionally. A unit display panel in which an organic electroluminescent device and a polymer-dispersed liquid crystal device are laminated from the outside is configured on at least one surface of the polyhedron shape of the voxels.

14 Claims, 12 Drawing Sheets

(56) References Cited

U.S. PATENT DOCUMENTS

| | | | |
|---|---|---|---|
| 7,587,120 B2* | 9/2009 | Koo | H04N 13/395 |
| | | | 385/147 |
| 10,002,489 B2* | 6/2018 | Collette | G07F 17/3211 |
| 10,029,422 B2* | 7/2018 | Meisner | B29C 48/266 |
| 10,110,884 B2* | 10/2018 | Frayne | G02B 27/2278 |
| 10,228,506 B2* | 3/2019 | Chung | G02B 5/1819 |
| 10,236,027 B1* | 3/2019 | Georgiou | G11B 7/127 |
| 10,284,753 B1* | 5/2019 | Naik | H04N 5/2226 |
| 10,379,280 B2* | 8/2019 | Chung | G02B 6/0068 |
| 2002/0163482 A1* | 11/2002 | Sullivan | G02B 27/2278 |
| | | | 345/6 |
| 2004/0091084 A1* | 5/2004 | Griffith | G06T 15/08 |
| | | | 378/210 |
| 2012/0113096 A1* | 5/2012 | Estrada | H04N 13/393 |
| | | | 345/419 |
| 2015/0372064 A1* | 12/2015 | Kim | G02F 1/133504 |
| | | | 349/33 |
| 2015/0378205 A1* | 12/2015 | Kim | C09K 19/02 |
| | | | 349/33 |
| 2016/0063758 A1 | 3/2016 | Schroecker | |
| 2016/0199012 A1* | 7/2016 | Choi | A61B 6/14 |
| | | | 378/40 |
| 2017/0061904 A1* | 3/2017 | Lin | G09G 3/3426 |
| 2017/0090209 A1* | 3/2017 | Brindisi | G02B 27/2271 |
| 2017/0214909 A1* | 7/2017 | Subrahmanyam | G02B 27/2271 |
| 2018/0190217 A1* | 7/2018 | Jung | G02F 1/133514 |
| 2019/0130801 A1* | 5/2019 | Kim | H01L 27/3267 |

* cited by examiner

VOLUMETRIC TYPE THREE-DIMENSIONAL DISPLAY DEVICE

CROSS-REFERENCE TO RELATED APPLICATIONS

This application claims the priority of Korean Patent Application No. 10-2017-0138735 filed on Oct. 24, 2017, in the Korean Intellectual Property Office, the disclosure of which is incorporated herein by reference.

BACKGROUND

Field

The present disclosure relates to a three-dimensional display device, and more particularly, to a volumetric type three-dimensional display device in which a plurality of voxels are three-dimensionally laminated.

Description of the Related Art

A three-dimensional imaging technology which enables three-dimensional depth and stereoscopic feelings from planar images has a wide impact on home appliances, communication industries, aerospace, arts industries, and automobile business as well as directly related fields such as displays.

One of the important factors which allow a human to feel depth and stereoscopic feelings is binocular parallax due to a distance between both eyes. The three-dimensional images are formed by the principle of stereoscopic vision through the two eyes of a human so that the binocular parallax caused by the distance between the two eyes which is approximately 65 mm may be one of the important factors of the stereoscopic effect. In addition to this, the three-dimensional images are also deeply related to psychological and memory factors. Therefore, the three-dimensional imaging technique is also divided into a volumetric type, a holographic type, and a stereoscopic type based on how much three-dimensional image information is supplied to an observer.

The volumetric type is a method which makes perception of a depth direction to be felt by the psychological factor and a suction effect. The volumetric type is being applied to a three-dimensional computer graphic which displays a perspective view, superposition, shade, and contrast, and motion by calculation or so-called IMAX films which provide a large screen having a wide viewing angle to an observer to cause optical illusion to be sucked into the space.

The holographic type which is known as the most complete stereoscopic imaging technology is represented by laser light reproduction holography or white light reproduction holography.

The stereoscopic type is a method of feeling a stereoscopic effect using the physiological factors of both eyes. Such a stereoscopic type can be classified into a glasses type using special glasses on an observer side depending on a location where an actual stereoscopic effect is generated or a glasses-free type using a lens array such as a parallax barrier or a lenticular, or integral on a display surface side.

Among them, the volumetric type is widely studied because it provides a large screen.

The volumetric type three-dimensional display device physically forms an actual shape in a space to represent a three-dimensional image. A physical voxel is formed to provide all psychological depth cognitive factors to represent a very natural three-dimensional image.

The volumetric type three-dimensional display device can be classified into a rotary screen, a multi-depth flat screen, a variable-focus lens, or a cross-beam type depending on a method of forming the voxel in the space.

However, it is difficult for the volumetric type three-dimensional display device of the related art to properly represent an outline of an object due to interference of light from surrounding pixels. Further, when a laser plasma or a light emitting diode (LED) is used, it is difficult to represent gray scales and colors and some technologies have a difficulty in implementation of a real volumetric type three-dimension which can be simultaneously watched at all directions of 360 degrees.

SUMMARY

The inventor of the present disclosure invented a volumetric type three-dimensional display device in which voxels having a polyhedron shape are three-dimensionally laminated. That is, the inventor of the present disclosure invented three-dimensionally laminate voxels having a polyhedral shape and configured a unit display panel which is formed of an organic electroluminescent device and polymer-dispersed liquid crystal display device, on each side of the polyhedron shape of the voxels. Therefore, color and gray scales are represented using an organic electroluminescent device and light at opposite side is blocked using the polymer-dispersed liquid crystal display device so that difficulty of expressing an outline of an object due to the interference of light can be removed.

An object to be achieved by the present disclosure is to provide a volumetric type three-dimensional display device which installs a polymer-dispersed liquid crystal display device at an opposite side to an emission direction of the organic electroluminescent device to block light from the opposite side, thereby minimizing interference of light emitted from surrounding pixels.

Another object to be achieved by the present disclosure is to provide a volumetric type three-dimensional display device which implements a real volumetric type three-dimension which can be simultaneously watched at all directions of 360 degrees by representing color and gray scale using an organic electroluminescent device in each of voxels which are three-dimensionally laminated.

Objects of the present disclosure are not limited to the above-mentioned objects, and other objects, which are not mentioned above, can be clearly understood by those skilled in the art from the following descriptions.

According to an aspect of the present disclosure, it is provided a volumetric type three-dimensional display device comprising a plurality of voxels having a polyhedron shape laminated three-dimensionally and a unit display panel in which an organic electroluminescent device and a polymer-dispersed liquid crystal device are laminated from the outside is configured on at least one surface of the polyhedron shape of the voxels.

Other detailed matters of the embodiments are included in the detailed description and the drawings.

According to another aspect of the present disclosure, the volumetric type three-dimensional display device represents the colors and gray scales using an organic electroluminescent device and blocks light at the opposite side using the polymer-dispersed liquid crystal device in each voxel, thereby removing a difficulty in representation of an outline of the object due to the interference of light. Therefore, very natural three-dimensional images having clear color and gray scale can be implemented.

According to the present disclosure, it is possible to implement a real volumetric type three-dimension which can be simultaneously watched in all directions of 360 degrees by representing the colors and gray scales using the organic electroluminescent device in each of voxels which are three-dimensionally laminated.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
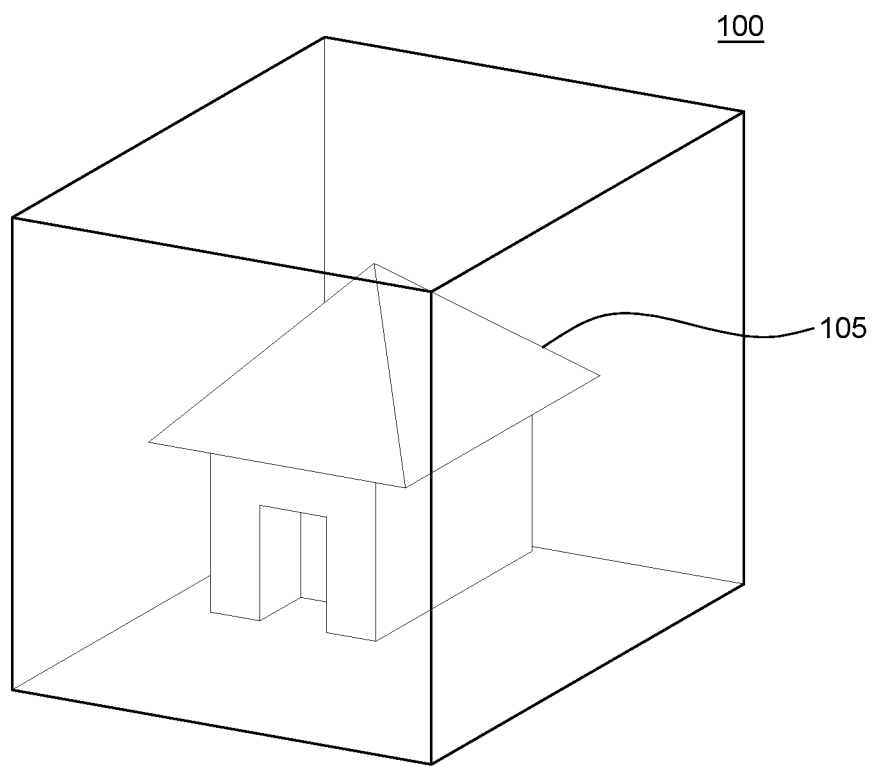
FIG. 1 is a perspective view illustrating a volumetric type three-dimensional display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to embodiments of the present disclosure will be described in detail with reference to accompanying drawings.

FIG. 1 is a perspective view illustrating a volumetric type three-dimensional display device according to an embodiment of the present disclosure. All the components of the volumetric type three-dimensional display according to all embodiments of the present disclosure are operatively coupled and configured.

Figure 2:
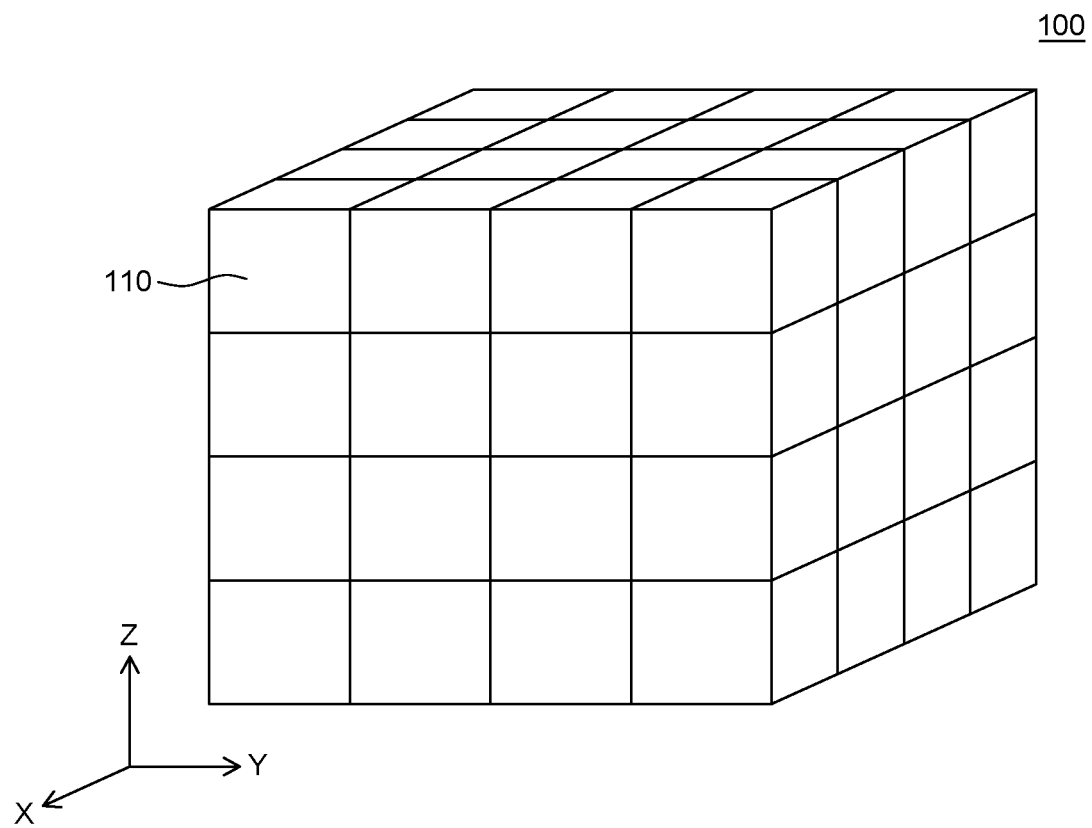
FIG. 2 is a perspective view for explaining a volumetric type three-dimensional display device according to an embodiment of the present disclosure.

FIG. 2 is a perspective view for explaining a volumetric type three-dimensional display device according to an embodiment of the present disclosure.

Figure 3:
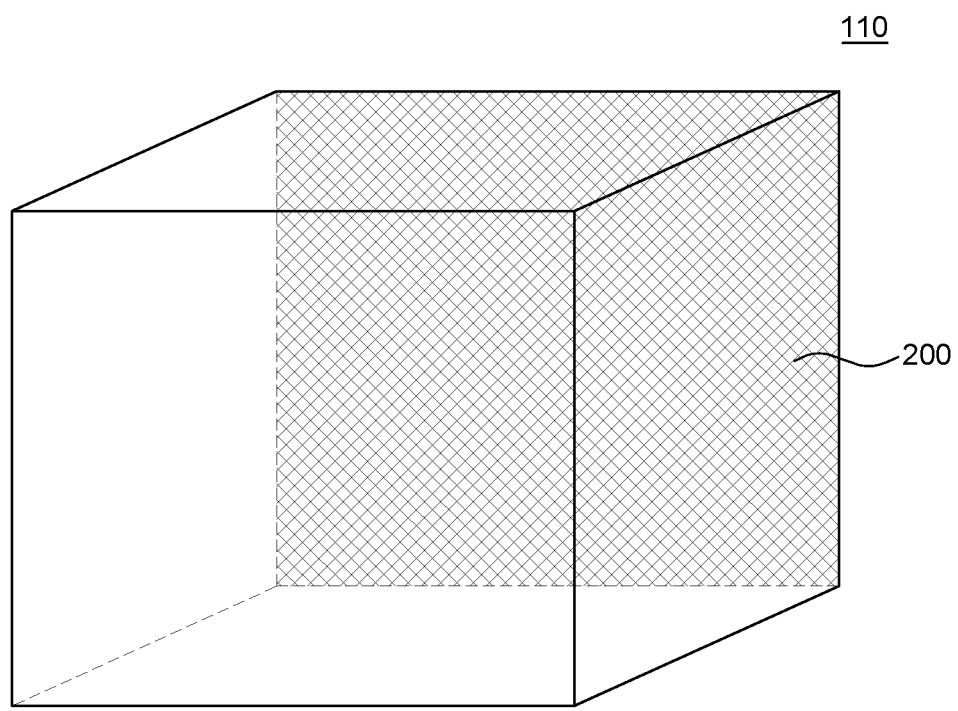
FIG. 3 is a view illustrating one voxel as an example, in a volumetric type three-dimensional display device according to an embodiment of the present disclosure which is illustrated in FIG. 2.

FIG. 3 is a view illustrating one voxel as an example, in a volumetric type three-dimensional display device according to an embodiment of the present disclosure which is illustrated in FIG. 2.

Referring to FIGS. 1 to 3, a volumetric type three-dimensional display device 100 according to an embodiment of the present disclosure can be formed by three-dimensionally laminating at least one voxel 110.

For example, the volumetric type three-dimensional display device 100 can be in a hexahedron shape. Hereinafter, even though it will be described that the volumetric type three-dimensional display device 100 has a hexahedron shape, a shape of the volumetric type three-dimensional display device 100 according to the present disclosure is not limited thereto. The voxel 110 can also have a hexahedron shape, but the present disclosure is not limited thereto.

For example, referring to FIG. 2, the volumetric type three-dimensional display device 100 according to the embodiment of the present disclosure can have a (regular) hexahedron shape formed by laminating 64 (regular) hexahedral voxels 110. However, the present disclosure is not limited thereto and the volumetric type three-dimensional display device 100 can have various (regular) polyhedron shape such as a (regular) tetrahedron shape, a (regular) octahedron shape, a (regular) dodecahedron shape, and a (regular) icosahedron shape, in addition to a (regular) hexahedron shape.

As the number of voxels 110 included in the volumetric type three-dimensional display device 100 is increased, the three-dimensional image can be more finely represented. Therefore, in FIG. 2, an example of having 64 voxels 110 is illustrated, but the number of voxels 110 is not limited thereto and other numbers are possible.

Further, the volumetric type three-dimensional display device 100 according to the embodiment of the present disclosure and the voxels 110 can have an irregular shape in addition to the above-described (regular) polyhedron.

As described above, the volumetric type is a method which makes perception of a depth direction to be felt by the psychological factor and a suction effect.

To this end, the volumetric type three-dimensional display device 100 represents a three-dimensional image 105 by physically forming a real shape in a space. That is, a physical voxel 110 is formed in a three-dimensional space to provide all psychological depth cognitive factors to represent a very natural three-dimensional image.

However, a volumetric type three-dimensional display device of a related art has a difficulty not only in proper representation of an outline of an object due to interference of light from surrounding pixels, but also in some gray scale and color representation. Further, some technologies have a difficulty in implementation of a real volumetric type three-dimension which is simultaneously watched from all directions of 360 degrees.

Therefore, the present disclosure provides a volumetric type three-dimensional display device 100 in which voxels 110 having a polyhedron shape are three-dimensionally laminated.

That is, in the volumetric type three-dimensional display device 100 according to the embodiment of the present disclosure, the voxels 110 having a polyhedron shape are three-dimensionally laminated. Further, a unit display panel 200 which is formed of an organic electroluminescent device (OLED) and a polymer-dispersed liquid crystal display device (PDLC) is configured on at least one surface of the polyhedron 110.

In addition, a cover can wrap an outer side of the three-dimensional shape formed by laminating the voxels 110 having a polyhedron shape. The cover can be a transparent material.

In this case, the organic electroluminescent device is configured on an outer side of one surface of the voxel 110 and the polymer-dispersed liquid crystal display device can be configured therein to be attached to the organic electroluminescent device.

The unit display panel 200 is formed of a transparent material to be also used as a transparent display.

The unit display panel 200 can be configured on at least one surface of the voxel(s) 110. However, the unit display panel 200 can be configured in only one voxel 110 so as not to overlap each other on a surface on which the adjacent voxels 110 abut.

Hereinafter, a structure of the unit display panel will be described in detail with reference to the drawings.

Figure 4:
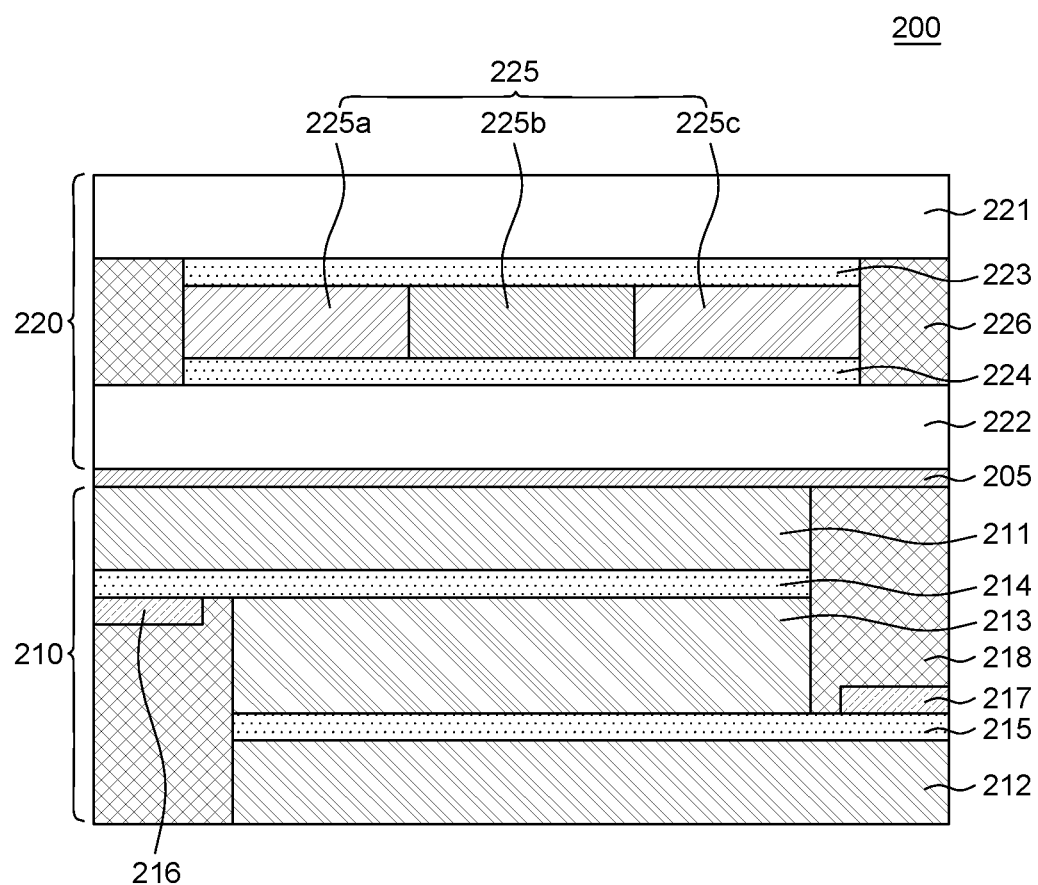
FIG. 4 is a cross-sectional view illustrating one unit display panel as an example in a voxel according to an embodiment of the present disclosure illustrated in FIG. 3.
Figure 5:
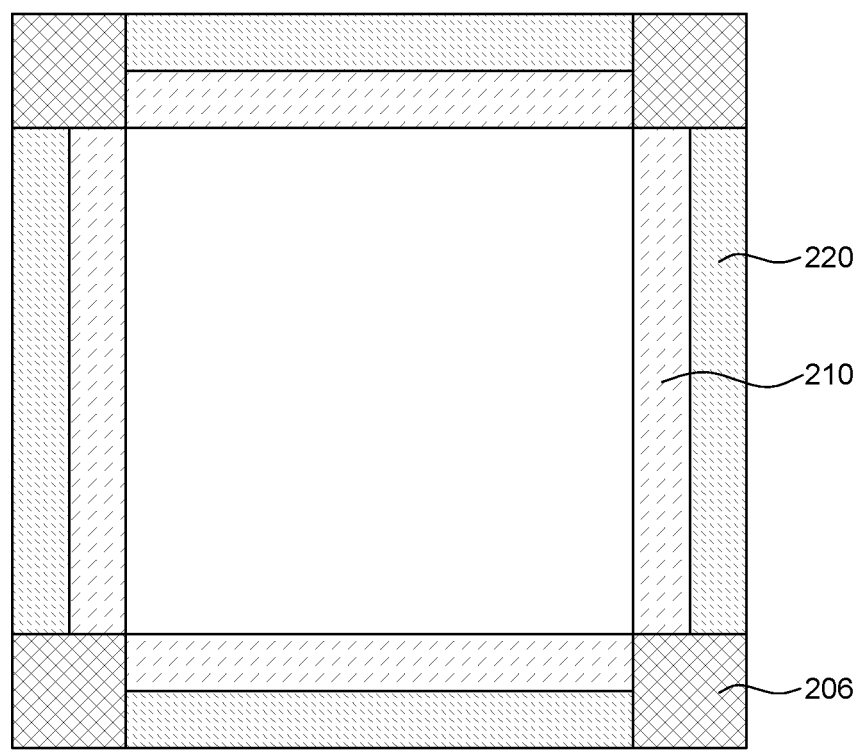
FIG. 5 is a cross-sectional view illustrating a voxel according to the embodiment of the present disclosure illustrated in FIG. 3.

FIG. 4 is a cross-sectional view illustrating one unit display panel as an example in a voxel according to an embodiment of the present disclosure illustrated in FIG. 3. FIG. 5 is a cross-sectional view illustrating a voxel according to the embodiment of the present disclosure illustrated in FIG. 3.

Referring to FIG. 4, the unit display panel 200 according to the embodiment of the present disclosure is formed of an organic electroluminescent device 220 and a polymer-dispersed liquid crystal display device 210.

An adhesive agent 205 can be interposed between the organic electroluminescent device 220 and the polymer-dispersed liquid crystal display device 210. Further, a sealing unit 206 which encapsulates a side of the unit display panel 200 can be provided at least one corner of the polyhedron (see FIG. 5).

The organic electroluminescent device 220 is located on an outer side of the polyhedron surface of each voxel 110 and the polymer-dispersed liquid crystal display device 210 can be located therein (see FIG. 5). Therefore, light emitted from the organic electroluminescent device 220 can be radiated to the outside of the polyhedron surface of each voxel 110.

For example, the organic electroluminescent device 220 can include a substrate 222 partitioned into a plurality of sub pixels, a first electrode 224 on the substrate 222, an organic layer 225 on the first electrode 224, a second electrode 223 on the organic layer 225, and a protective film 221 on the second electrode 223.

The organic electroluminescent device 220 is a device in which holes and electrons are injected from the first electrode 224 and the second electrode 223 into an organic light emitting layer and excitons formed by coupling the injected holes and electrons fall from an excited state to a ground state to emit light having a predetermined wavelength.

By this principle, differently from the liquid crystal display device of the related art, the organic electroluminescent device 220 does not require a separate light source so that a volume and a weight of the device can be reduced.

In this case, even though FIG. 4 illustrates a top emission type organic electroluminescent device 220 as an example, the present disclosure is not limited thereto. The present disclosure can also be applied to a bottom emission type organic electroluminescent device 220 and in this case, the substrate 222 of the organic electroluminescent device 220 is located outside the voxel 110.

As the substrate 222, a transparent insulating substrate can be used and an example of a material thereof can include glass or plastic.

Specifically, as the transparent substrate 222, a polymer material such as plastic can be used. The polymer material has an advantage of being light and flexible. Recently, a transparent nanofiber having a diameter of 100 nm or smaller is used as a reinforcing material so that a polymer substrate having flexibility, transparency having 85% or higher transmittance, and low thermal expansion coefficient can be manufactured.

The protective film 221 can also be formed of a transparent material.

The first electrode 224 can be electrically connected to a drain electrode of a thin film transistor. The first electrode 224 serving as an anode can be formed of a conductive material having a high work function to supply holes to the organic layer 225. For example, the first electrode 224 can be formed of a transparent conductive material such as indium tin oxide (ITO), indium zinc oxide (IZO), or indium tin zinc oxide (ITZO).

The organic layer 225 includes an organic light emitting layer for emitting specific color light and includes one of a red organic light emitting layer 225a, a green organic light emitting layer 225b, and a blue organic light emitting layer 225c. The organic light emitting layer 225 can further include various sub layers such as a hole transport layer, a hole injecting layer, an electron injecting layer, or an electron transport layer. That is, in order to further increase a luminous efficiency, an electron transport layer can be added between the second electrode 223 and the organic light emitting layer 225 and a hole transport layer can be added between the first electrode 224 and the organic light emitting layer 225.

The organic layer 225 can emit light toward the outside of the voxel 110.

In FIG. 4, it is illustrated that the substrate 222 is partitioned into a plurality of sub pixels and each sub pixel include a red sub pixel which emits red light, a green sub pixel which emits green light, and a blue sub pixel which emits blue light. Further, in FIG. 4, it is illustrated that each sub pixel includes a red organic light emitting layer 225a, a green organic light emitting layer 225b, and a blue organic light emitting layer 225c, as an example, but the present disclosure is not limited thereto. Each sub pixel can further include a transmissive unit disposed in the red, green, and blue sub pixels. Alternatively, each sub pixel can further include a transmissive unit in addition to the red, green, and blue sub pixels.

The second electrode 223 can be disposed on the organic layer 225. The second electrode 223 serving as a cathode supplies electrons to the organic layer 225. The second electrode 223 can be formed of transparent conductive oxide such as indium tin oxide (ITO), indium zinc oxide (IZO), indium tin zinc oxide (ITZO), zinc oxide (ZnO), and tin oxide (TO) or an ytterbium (Yb) alloy.

In a non-display area, a predetermined wiring line can be disposed and the wiring line can be formed of the same material as a conductive component disposed in the display area. For example, the wiring line can be formed of the same material as the first electrode 224, but the present disclosure is not limited thereto.

A part of the wiring line is electrically connected to the second electrode 223 and a power supply line to supply the power from the power supply line to the second electrode 223. That is, a low potential voltage transmitted from the chip on film (COF) sequentially passes through the power supply line and the wiring line to be transmitted to the second electrode 223.

An encapsulating unit which protects the organic layer 225 which is vulnerable to moisture can be formed above the organic layer 225 to suppress the organic layer from being exposed to the moisture. For example, the encapsulating layer can have a structure in which an inorganic layer and an organic layer are alternately laminated.

Even though a first sealing unit 226 can be provided on a side of the organic electroluminescent device 220 configured as described above, the present disclosure is not limited thereto.

Next, the polymer-dispersed liquid crystal display device 210 is a display device which displays images by changing an amount of transmitted light of liquid crystals dispersed in a polymer. However, in the present disclosure, the polymer-dispersed liquid crystal display device can be provided at an opposite side to an emission direction of the organic luminescent device 220 to block light at the opposite side. That is, in the polymer-dispersed liquid crystal display device 210 according to the embodiment of the present disclosure blocks light emitted from pixels distributed around the voxel 110 which implements an outline of a three-dimensional image, that is, another voxel 110 to minimize the interference of light.

Figure 6A:
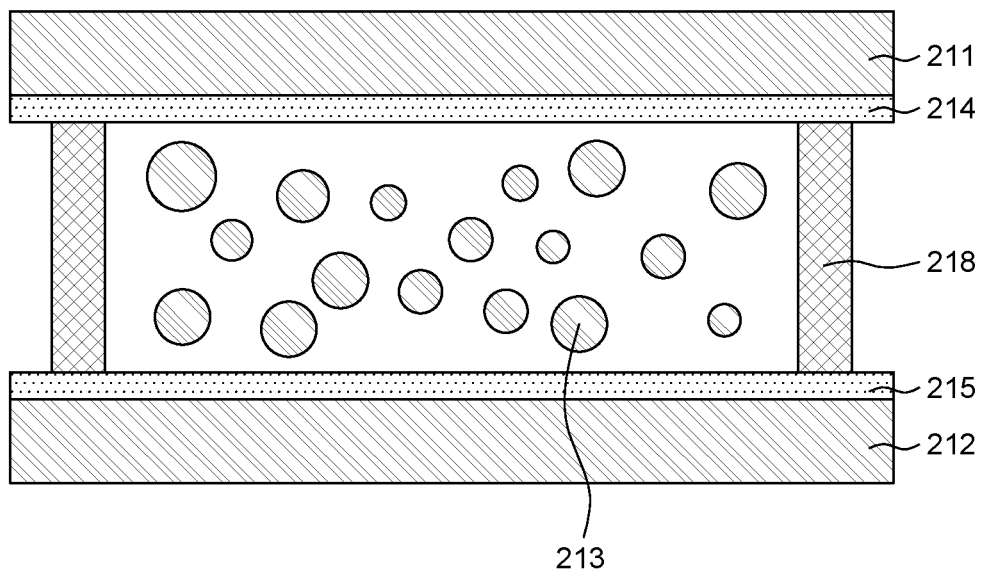
FIGS. 6A and 6B are views illustrating cross-sections of a polymer-dispersed liquid crystal display device and a polymer-dispersed liquid crystal display device cell, as an example, in a unit display panel according to an embodiment of the present disclosure illustrated in FIG. 4.
Figure 6B:
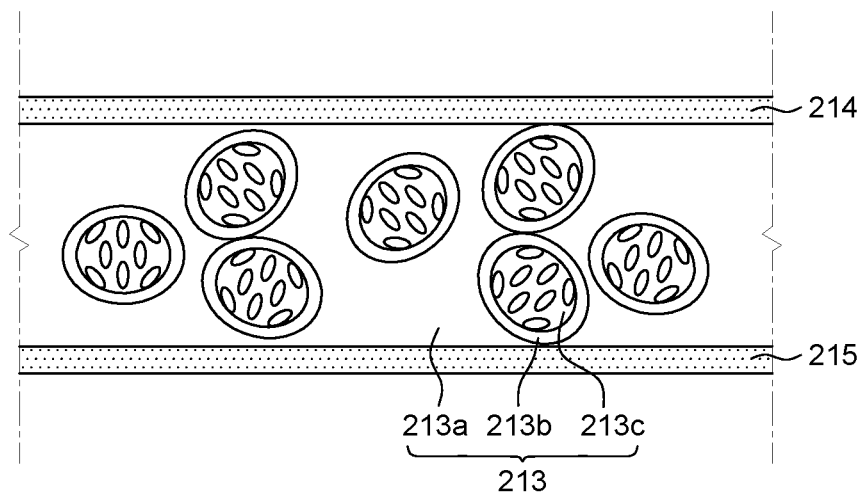

FIGS. 6A and 6B are views illustrating cross-sections of a polymer-dispersed liquid crystal display device and a polymer-dispersed liquid crystal display device cell, as an example, in a unit display panel according to an embodiment of the present disclosure illustrated in FIG. 4.

Figure 7A:
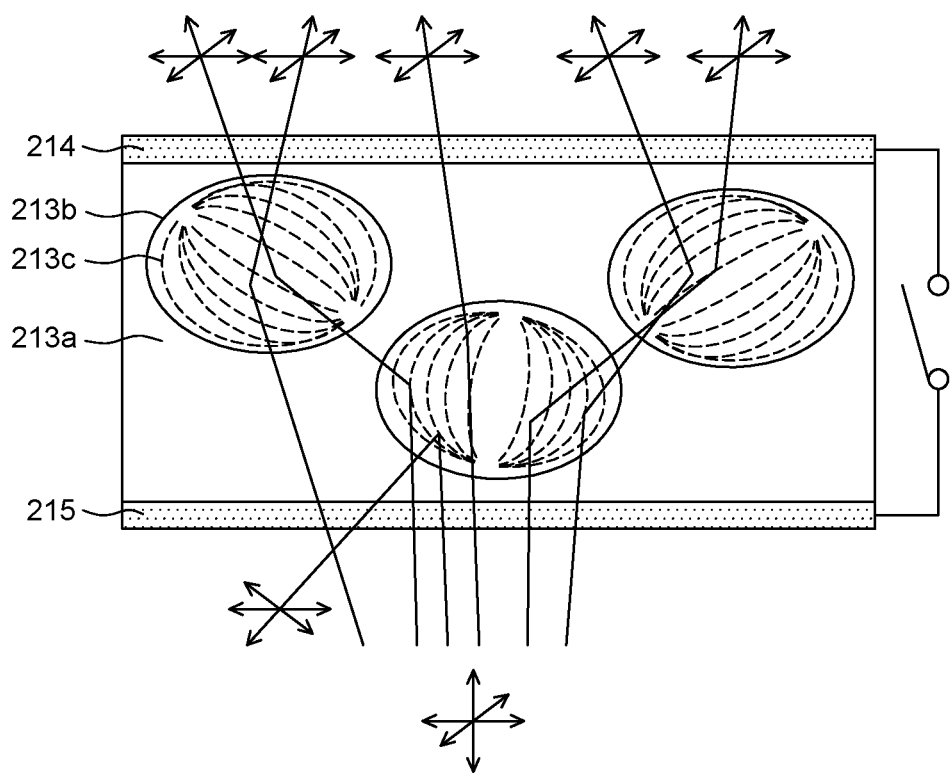
FIGS. 7A and 7B are cross-sectional views illustrating a driving principle of a polymer-dispersed liquid crystal display device according to an embodiment of the present disclosure.
Figure 7B:
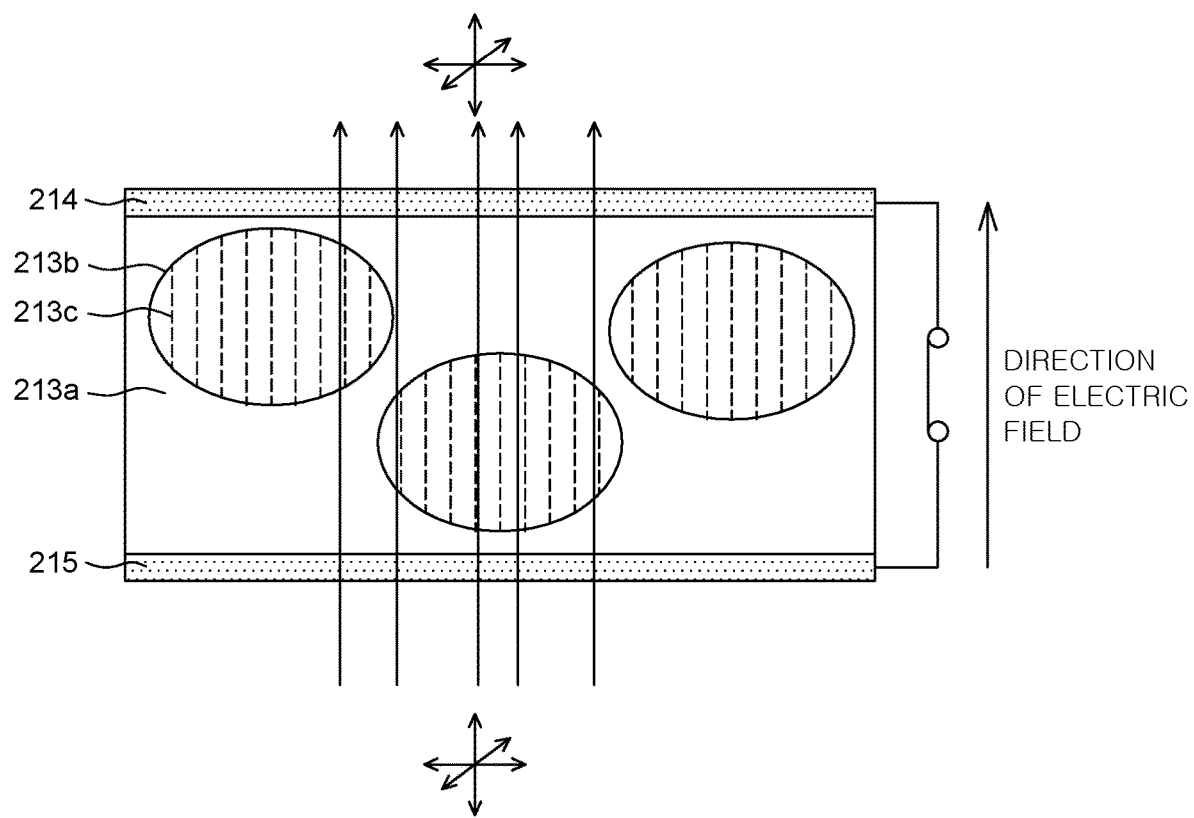

FIGS. 7A and 7B are cross-sectional views illustrating a driving principle of a polymer-dispersed liquid crystal display device according to an embodiment of the present disclosure.

Referring to FIG. 6A (and FIG. 4), the polymer-dispersed liquid crystal display device 210 according to the embodiment of the present disclosure includes a first substrate 211 and a second substrate 212 which are bonded to be opposite to each other, first and second electrodes 214 and 215 disposed in the first and second substrates 211 and 212, respectively, and a polymer-dispersed liquid crystal layer 213 disposed between the first and second electrodes 214 and 215.

A second sealing unit 218 can be provided at the side of the first and second substrates 211 and 212 so as to suppress the liquid crystal from flowing between the first and second substrates 211 and 212.

The second sealing unit 218 can be configured by a conductive adhesive agent and can be located on one corner of the polyhedron together with the first sealing unit 226.

For example, the polymer-dispersed liquid crystal layer 213 is configured by a polymer-dispersed liquid crystal display device cell which is configured by liquid crystals 213c filled in a capsule-shaped polymer ball 213b so that an alignment of the liquid crystals 213c is changed in accordance with the applied voltage of the first and second electrodes 214 and 215. In this case, the polymer balls 213b can be irregularly dispersed on a polymer layer 213a of the polymer-dispersed liquid crystal display device cell.

The first and second substrates 211 and 212 can be configured by a transparent film.

The first and second electrodes 214 and 215 can be formed of transparent conductive oxide such as indium tin oxide (ITO), indium zinc oxide (IZO), indium tin zinc oxide (ITZO), zinc oxide (ZnO), and tin oxide (TO). The first and second electrodes 214 and 215 can be applied with voltages from the first and second transparent wiring lines 216 and 217 (see FIG. 4).

Such a structure of the polymer-dispersed liquid crystal display device uses a phenomenon that when two types of liquids which are transparent but are not dissolved with each other and have different refractive indices are forcibly mixed, the whole liquids become a milky white state. This phenomenon is caused because the mixed liquids become opaque and light is scattered from the interface due to the difference in refractive indices of two liquids when the light passes through the interface.

When the voltage is not applied to the polymer-dispersed liquid crystal display device 210 configured as described above, referring to FIG. 7A, all the incident light is scattered due to the different refractive indices between the liquid crystal 213c and the polymer ball 213b so that the polymer-dispersed liquid crystal display device becomes a milky white opaque state.

However, when the voltage is applied to the first and second electrodes 214 and 215 of the polymer-dispersed liquid crystal display device 210, referring to FIG. 7B, the liquid crystals 213c are aligned to an electric field direction so that all particles have the constant refractive index. In this case, when the refractive indices of the polymer ball 213b and the liquid crystal 213c are equal to each other, scattering is not caused at the interface therebetween and it looks transparent.

Therefore, the transmittance of the polymer-dispersed liquid crystal display device 210 varies depending on whether the voltage is on or off and functions to block the light at an opposite side to the emission direction of the organic electroluminescent device 220 using this property.

The volumetric type three-dimensional display device 100 according to the embodiment of the present disclosure represents the color and the gray scales using the organic electroluminescent device 220 and blocks light other than light in the emission direction of the organic electroluminescent device 220 using the polymer-dispersed liquid crystal display device 210 so that a difficulty in representation of an outline of an object due to the interference of light can be solved.

Further, it is possible to implement a real volumetric type three-dimension which can be simultaneously watched at all directions of 360 degrees by representing the colors and gray scales using the organic electroluminescent device 220 in each of voxels 110 which are three-dimensionally laminated.

The volumetric type three-dimensional display device 100 according to the embodiment of the present disclosure configured as described above operates organic electroluminescent devices 220 of the voxel 110 corresponding to a three-dimensional coordinate value of a three-dimensional object to generate a three-dimensional image.

In this case, the organic luminescent device 220 can emit light with a color corresponding to a pixel value corresponding to the three-dimensional coordinate value. The pixel value can be a digital value which represents a color, a brightness, and a saturation.

Figure 8:
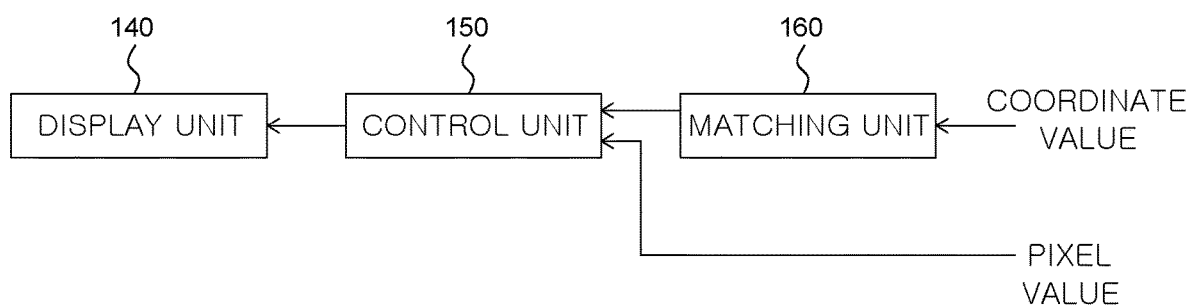
FIG. 8 is a view for explaining the driving of a volumetric type three-dimensional display device according to an embodiment of the present disclosure.

FIG. 8 is a view for explaining the driving of a volumetric type three-dimensional display device according to an embodiment of the present disclosure.

Referring to FIG. 8, the volumetric type three-dimensional display device according to an embodiment of the present disclosure can include a display unit 140, a control unit 150, and a matching unit 160.

The display unit 140 can be configured by the above-described voxels.

In this case, the matching unit 160 can match coordinate values of an object and voxels of the volumetric type three-dimensional display device. For example, the coordinate value of the object can be a three-dimensional coordinate value or a two-dimensional coordinate value. The matching unit 160 matches the coordinate value of the object with the voxel. For example, when the coordinate value of the object is (3, 1, 2), the matching unit 160 extracts a voxel corresponding to the coordinate value of the object and matches the coordinate value of the object with a pixel value of the extracted voxel. Further, when the coordinate value of the object is (3, 1, 3), the matching unit 160 extracts a voxel corresponding to the coordinate value of the object and matches the coordinate value of the object with a pixel value of the extracted voxel.

The control unit 150 can operate the organic electroluminescent device of the voxel based on the matching result and the pixel value which matches the coordinate value of the object. The control unit 150 can receive the pixel value which is matched to the coordinate value of the object from an internal or external storage device. For example, the control unit 150 can select a voxel corresponding to the coordinate value of the object. The control unit 150 can extract a pixel value of a voxel corresponding to the coordinate value of the object. The control unit 150 operates the organic electroluminescent device of the selected voxel so as to emit light having a color corresponding to the extracted pixel value. Therefore, the control unit 150 operates a voxel corresponding to the coordinate value of an outermost side of the object so that the image of the object can be displayed on the volumetric type three-dimensional display device. However, the present disclosure is not limited thereto and the control unit 150 operates voxels corresponding to all the coordinate values of the object to display the image of the object on the volumetric type three-dimensional display device.

Further, a volume of an object can be represented by converting outermost data of the three-dimensional object, that is, the outermost coordinate value as much as the maximum size of the volumetric type three-dimensional display device and displaying the outermost coordinate value in the corresponding voxel. That is, when coordinate values of the three-dimensional object are input, the coordinate values are normalized and rescaled to X, Y, and Z axes and then displayed in the corresponding voxel.

Further, time continuous row, column, and height three-dimensional matrix operations are periodically repeated to represent moving images.

The organic electroluminescent device and the polymer-dispersed liquid crystal display device are controlled by one control unit 150. For example, a gate driver and a data driver are controlled by a timing controller to simultaneously drive the organic electroluminescent device and control the switching of the polymer-dispersed liquid crystal display device.

FIGS. 9A to 9D are views illustrating a sub-pixel configuration of an organic electroluminescent device in the unit display panel according to an embodiment of the present disclosure illustrated in FIG. 4 as an example.

In this case, for example, the sub-pixel configuration of FIGS. 9A to 9D includes a predetermined transmitting unit to improve transmittance.

Referring to FIGS. 9A to 9D, as described above, the organic electroluminescent device 220, 320, 420, and 520 according to the embodiment of the present disclosure can be partitioned into a plurality of sub pixels.

The sub pixels can be configured by a red sub pixel Pr which emit red light, a green sub pixel Pg which emit green light, and a blue sub pixel Pb which emit blue light. However, the present disclosure is not limited thereto.

Figure 9A:
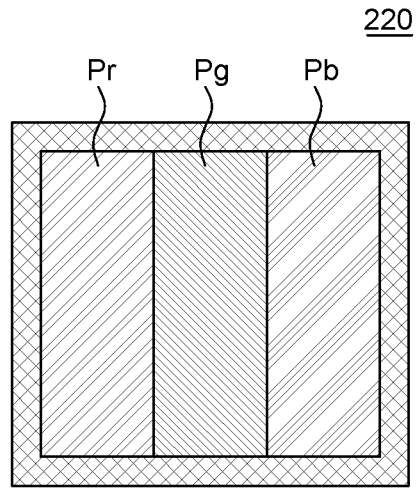
FIGS. 9A to 9D are views illustrating a sub-pixel configuration of an organic electroluminescent device, as an example, in the unit display panel according to an embodiment of the present disclosure illustrated in FIG. 4.
Figure 9B:
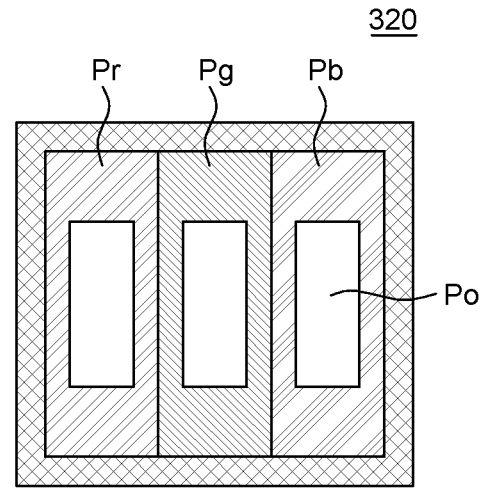
Figure 9C:
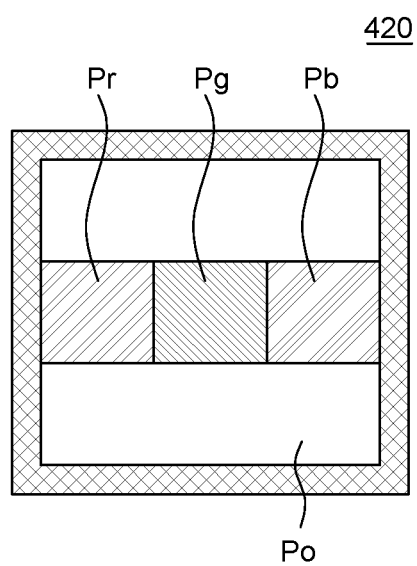
Figure 9D:
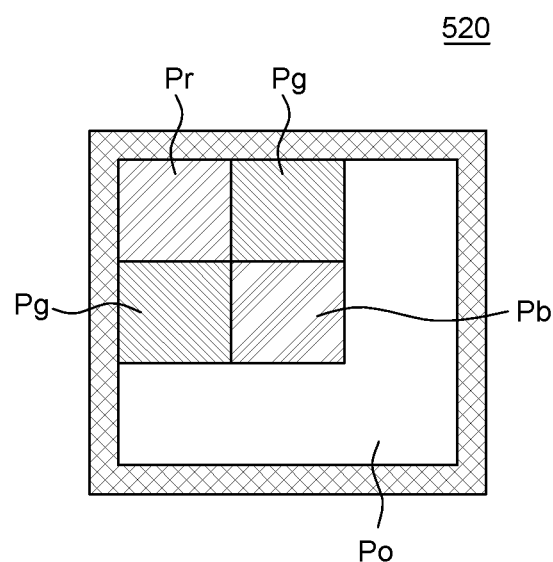
Figure 10A:
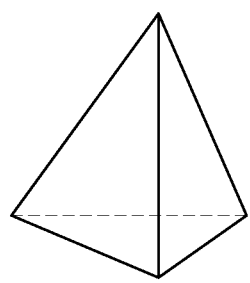
FIGS. 10A to 10D are views illustrating a volumetric type three-dimensional display device according to another embodiment of the present disclosure as an example.
Figure 10B:
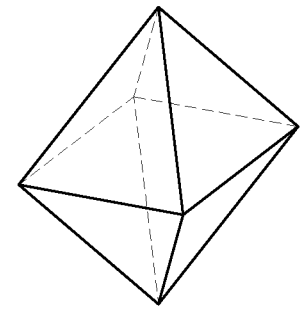
Figure 10C:
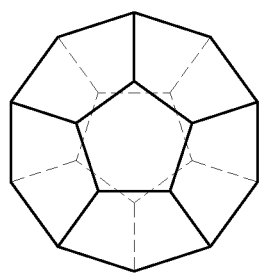
Figure 10D:
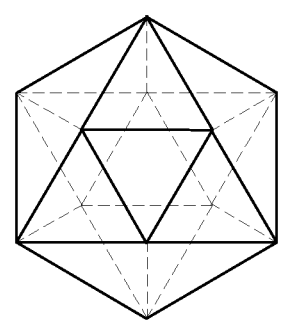

Further, the sub pixel can further include a transmitting unit Po disposed in the red sub pixel Pr, the green sub pixel Pg, and the blue sub pixel Pb (see FIG. 9B). In this case, the transmitting unit Po does not include any of light emitting layers and can be configured by a white sub pixel which emits white light.

Alternatively, the sub pixel can further include a transmitting unit Po in addition to the red sub pixel Pr, the green sub pixel Pg, and the blue sub pixel Pb. In this case, the transmitting unit Po can be located above and below the red sub pixel Pr, the green sub pixel Pg, and the blue sub pixel Pb (see FIG. 9C) or located at sides of at least two sub pixels Pg and Pb (see FIG. 9D).

FIGS. 10A to 10D are views illustrating a volumetric type three-dimensional display device according to another embodiment of the present disclosure as an example.

Referring to FIGS. 10A to 10D, a volumetric type three-dimensional display device according to another embodiment of the present disclosure can have various (regular) polyhedron shape such as a (regular) tetrahedron shape, a (regular) octahedron shape, a (regular) dodecahedron shape, and a (regular) icosahedron shape, in addition to a (regular) hexahedron shape.

The voxel also has various (regular) polyhedron shapes such as a (regular) tetrahedron shape, a (regular) octahedron shape, a (regular) dodecahedron shape, and a (regular) icosahedron shape, in addition to a (regular) hexahedron shape.

As the number of voxels included in the volumetric type three-dimensional display device is increased, the three-dimensional image can be more finely represented, but the present disclosure is not limited to the number of voxels.

Further, the volumetric type three-dimensional display device according to another embodiment of the present disclosure and the voxels can have an irregular shape in addition to the above-described (regular) polyhedron.

Figure 11A:
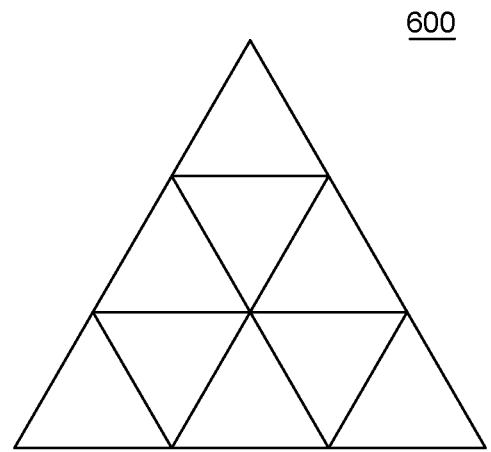
FIGS. 11A and 11B are exploded perspective views illustrating a configuration of a unit display panel according to another embodiment of the present disclosure.
Figure 11B:
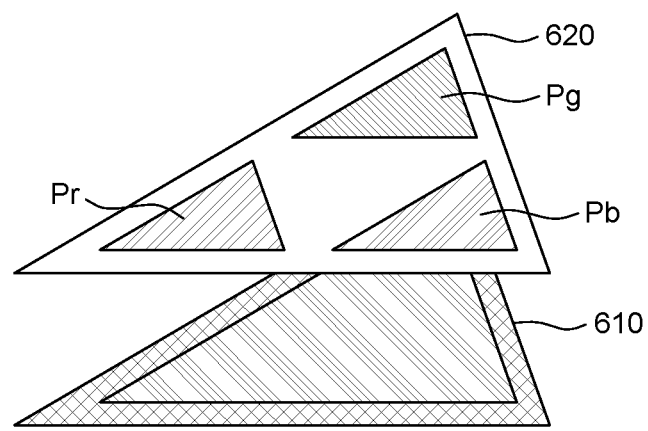

FIGS. 11A and 11B are exploded perspective views illustrating a configuration of a unit display panel according to another embodiment of the present disclosure.

Referring to FIGS. 11A and 11B, when the voxel has a (regular) tetrahedron shape, a (regular) octahedron shape or a (regular) icosahedron shape, in addition to a (regular) hexahedron shape, each surface can be formed to be a (regular) triangular form.

When each surface of the voxel is formed to be a (regular) triangular form, the organic electroluminescent device 620 and the polymer-dispersed liquid crystal display device 610 can also have a (regular) triangular form.

In contrast, when the voxel has a (regular) hexahedron shape, each surface can be formed to be a square.

Further, when the voxel has a (regular) dodecahedron shape, each side can be formed to be a (regular) pentagon.

The embodiments of the present disclosure can also be described as follows.

According to an aspect of the present disclosure, a volumetric type three-dimensional display device includes a plurality of voxels having a polyhedron shape laminated three-dimensionally and a unit display panel in which an organic electroluminescent device and a polymer-dispersed liquid crystal device are laminated from the outside is configured on at least one surface of the polyhedron shape of the voxels.

The organic electroluminescent device can include a substrate partitioned into a plurality of sub pixels, a first electrode on the substrate, an organic layer on the first electrode, a second electrode on the organic layer, and a protective film on the second electrode and the organic layer emits light toward an outside of the voxel.

The substrate and the protective film can be composed of a transparent material.

The sub pixel can include a red sub pixel which emits red light, a green sub pixel which emits green light, and a blue sub pixel which emits blue light.

The sub pixel can further include a transmitting unit in addition to the red, green, and blue sub pixels.

The polymer-dispersed liquid crystal display device can include a first substrate and a second substrate which are bonded to be opposite to each other; a first electrode and a second electrode disposed in the first substrate and the second substrate, respectively; and a polymer-dispersed liquid crystal layer disposed between the first electrode and the second electrode.

The first and second substrates can be composed of a transparent film.

The first and second electrodes can be transparent and be applied with a voltage from first and second transparent wiring lines.

The volumetric type three-dimensional display device can further comprise a cover which is formed of a transparent material to wrap an outer side of the three-dimensional shape.

The volumetric type three-dimensional display device can further comprise a sealing unit which is provided on at least one corner of the polyhedron to encapsulate a side of the unit display panel.

The three-dimensional shape can be one of a (regular) tetrahedron shape, a (regular) hexahedron shape, a (regular) octahedron shape, a (regular) dodecahedron shape, and a (regular) icosahedron shape.

A matching unit can extract a voxel corresponding to a coordinate value of an object and matches the coordinate value of the object and a pixel value of the extracted voxel.

A control unit selects a voxel corresponding to the coordinate value of the object, extracts the pixel value of the voxel corresponding to the coordinate value of the object, and drives the organic electroluminescent device of the selected voxel to represent colors and gray scales corresponding to the extracted pixel value and the control unit blocks light at an opposite side to an emission direction of the organic electroluminescent device of the selected voxel using the polymer-dispersed liquid crystal display device of the selected voxel.

Although the embodiments of the present disclosure have been described in detail with reference to the accompanying drawings, the present disclosure is not limited thereto and can be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A volumetric type three-dimensional display device comprising:
   a plurality of voxels configured to display a three-dimensional (3D) image in a physical 3D space, each voxel among the plurality of voxels having at least three flat outer surfaces; and
   a plurality of unit display panels, each unit display panel among the plurality of unit display panels including:
      an organic electroluminescent device including at least one sub-pixel including an organic light emitting diode (OLED), and a polymer-dispersed liquid crystal device configured to have transparency for passing external light through the polymer-dispersed liquid crystal device and block the external light based on a voltage applied to the polymer-dispersed liquid crystal device, wherein each of the plurality of voxels includes one of the plurality of unit display panels disposed on one of the at least three flat outer surfaces of the corresponding voxel, and wherein the organic electroluminescent device is disposed at an outside of the one of the at least three flat outer surfaces of the corresponding voxel, and the polymer-dispersed liquid crystal device is disposed an inner side of the one of the at least three flat outer surfaces of the corresponding voxel in an area between a center of the corresponding voxel and the organic electroluminescent device.

2. The volumetric type three-dimensional display device according to claim 1, wherein the organic electroluminescent device includes:
a substrate partitioned into a plurality of sub pixels,
a first electrode on the substrate,
an organic layer on the first electrode,
a second electrode on the organic layer, and
a protective film on the second electrode, and
wherein the organic layer emits light toward an outside of the voxels.

3. The volumetric type three-dimensional display device according to claim 2, wherein the substrate and the protective film are composed of a transparent material.

4. The volumetric type three-dimensional display device according to claim 2, wherein at least one of the plurality of sub pixels includes a red sub pixel which emits red light, a green sub pixel which emits green light, and a blue sub pixel which emits blue light.

5. The volumetric type three-dimensional display device according to claim 4, wherein the at least one of the plurality of sub pixels further includes a transmitting unit disposed in the red, green, and blue sub pixels, the transmitting unit configured to have transparency and pass external light therethrough.

6. The volumetric type three-dimensional display device according to claim 4, wherein the at least one of the plurality of sub pixels further includes a transmitting unit in addition to the red, green, and blue sub pixels, the transmitting unit configured to have transparency and pass external light therethrough.

7. The volumetric type three-dimensional display device according to claim 1, wherein the polymer-dispersed liquid crystal display device includes:
a first substrate and a second substrate which are bonded to be opposite to each other;
a first electrode and a second electrode disposed in the first substrate and the second substrate, respectively; and
a polymer-dispersed liquid crystal layer disposed between the first electrode and the second electrode.

8. The volumetric type three-dimensional display device according to claim 7, wherein the first and second substrates are composed of a transparent film.

9. The volumetric type three-dimensional display device according to claim 7, wherein the first and second electrodes are transparent and are applied with a voltage from first and second transparent wiring lines.

10. The volumetric type three-dimensional display device according to claim 1, further comprising:
a cover formed of a transparent material to wrap an outer side of the three-dimensional shape of the display device.

11. The volumetric type three-dimensional display device according to claim 1, further comprising:
a sealing unit provided on at least one corner of the polyhedron to encapsulate a side of the unit display panel.

12. The volumetric type three-dimensional display device according to claim 1, wherein the three-dimensional shape of the display device is one of a tetrahedron shape, a hexahedron shape, an octahedron shape, a dodecahedron shape, and an icosahedron shape.

13. The volumetric type three-dimensional display device according to claim 1, wherein a matching unit extracts a voxel corresponding to a coordinate value of an object and matches the coordinate value of the object and a pixel value of the extracted voxel,
wherein a control unit selects a voxel corresponding to the coordinate value of the object, extracts the pixel value of the voxel corresponding to the coordinate value of the object, and drives the organic electroluminescent device of the selected voxel to represent colors and gray scales corresponding to the extracted pixel value, and
wherein the control unit blocks light at an opposite side to an emission direction of the organic electroluminescent device of the selected voxel using the polymer-dispersed liquid crystal display device of the selected voxel.

14. The volumetric type three-dimensional display device according to claim 1, further comprising:
a transparent substrate disposed between the organic electroluminescent device and the polymer-dispersed liquid crystal display device within each of the plurality of unit display panels for the plurality of voxels.

* * * * *